United States Patent
Bjune et al.

(10) Patent No.: US 8,484,823 B2
(45) Date of Patent: Jul. 16, 2013

(54) METHODS AND APPARATUS FOR MOUNTING A CRYSTAL

(75) Inventors: Caroline K. Bjune, Andover, MA (US); Thomas F. Marinis, Haverhill, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 317 days.

(21) Appl. No.: 12/868,383

(22) Filed: Aug. 25, 2010

(65) Prior Publication Data
US 2011/0047776 A1 Mar. 3, 2011

Related U.S. Application Data

(60) Provisional application No. 61/237,949, filed on Aug. 28, 2009.

(51) Int. Cl.
*B23P 11/02* (2006.01)

(52) U.S. Cl.
USPC .......................................................... 29/450

(58) Field of Classification Search
USPC .................. 29/450, 452, 446, 283.5; 73/826, 73/159
See application file for complete search history.

(56) References Cited

U.S. PATENT DOCUMENTS

| | | | |
|---|---|---|---|
| 1,692,063 A | 11/1928 | Trogner | |
| 2,371,613 A | 3/1945 | Fair | |
| 2,470,609 A | 5/1949 | Elmore et al. | |
| 2,482,730 A | 9/1949 | Flynn | |
| 2,671,178 A | 3/1954 | Tomcik | |
| 3,339,091 A | 8/1967 | Hammond et al. | |
| 3,747,176 A | 7/1973 | Toyoshima | |
| 4,054,808 A | 10/1977 | Tanaka | |
| 4,450,376 A | 5/1984 | Meitzler | |
| 5,184,043 A | 2/1993 | Yoshinaga | |
| 5,437,192 A * | 8/1995 | Kawamoto et al. | 73/826 |
| 5,714,917 A | 2/1998 | Ella et al. | |
| 5,767,612 A | 6/1998 | Takeuchi et al. | |
| 6,229,249 B1 | 5/2001 | Hatanaka et al. | |
| 6,441,539 B1 | 8/2002 | Kitamura et al. | |
| 6,584,660 B1 | 7/2003 | Shimogawa et al. | |
| 7,154,212 B1 | 12/2006 | Kosinski | |
| 7,414,349 B2 | 8/2008 | Sasaki | |
| 2007/0222336 A1 | 9/2007 | Grannen et al. | |
| 2008/0150397 A1 | 6/2008 | Marinis et al. | |
| 2008/0278731 A1 | 11/2008 | Majumdar et al. | |
| 2009/0102322 A1 | 4/2009 | Akane et al. | |
| 2010/0026398 A1 | 2/2010 | Moriya et al. | |

FOREIGN PATENT DOCUMENTS

| | | |
|---|---|---|
| FR | 2547458 A1 | 12/1984 |
| JP | 6006162 A | 1/1994 |
| JP | 9129941 A | 5/1997 |
| JP | 2004140397 A | 5/2004 |
| SU | 961101 A1 | 9/1982 |

OTHER PUBLICATIONS

International Search Report and Written Opinion of PCT/US2007/026259, 13 pages.
Examination Report for New Zealand Patent Application No. 577866, mailed Nov. 19, 2010, 2 pages.
Examination Report for Australian Patent Application No. 2007338699, mailed Jan. 12, 2011, 3 pages.

* cited by examiner

*Primary Examiner* — John C Hong
(74) *Attorney, Agent, or Firm* — Goodwin Procter LLP

(57) ABSTRACT

In various embodiments, a crystal is inserted within a flexible membrane through an opening formed by manipulation of the membrane.

12 Claims, 4 Drawing Sheets

METHODS AND APPARATUS FOR MOUNTING A CRYSTAL

RELATED APPLICATION

This application claims the benefit of and priority to U.S. Provisional Patent Application No. 61/237,949, filed Aug. 28, 2009, the entire disclosure of which is hereby incorporated herein by reference.

FIELD OF THE INVENTION

The technology disclosed herein relates generally to crystal packaging, specifically crystal packaging within a flexible membrane.

BACKGROUND

As the use of navigation systems increases in both the public and military sectors, there is an incentive to improve their robustness and to decrease the size of their individual components. One such component is the crystal oscillator, which supplies a stable clock frequency derived from the mechanical resonance of a piezoelectric crystal. Crystal oscillators may also be found in products such as test equipment, watches, and electronic circuits. Variants of the crystal oscillator engineered to reduce the impact of environmental factors such as temperature and humidity include the temperature-controlled (or -compensated) crystal oscillator (TCXO), the microcomputer-compensated crystal oscillator (MCXO) and the oven-controlled crystal oscillator (OCXO).

A TCXO, for example, typically includes a control chip electrically connected to the piezoelectric crystal oscillator. Traditionally, the control chip and the crystal are packaged in separate carriers that are then bonded together. The crystal may be attached to its carrier with epoxy, and electrical connections made between the two carriers. For example, the two carriers may be positioned on top of one another and soldered together. In some constructions, one end of the crystal is mounted inside its carrier using two small bumps of conductive epoxy. The two bumps may provide both the support and electrical contacts for the crystal.

Unfortunately, this arrangement may expose the crystal to local stresses at the attachment point that can deleteriously affect its performance and reliability. For example, considerable stress may occur when the package is subjected to an inertial load or a harsh environment. If the elastic limits of the structure (or portions thereof) are exceeded, a permanent change in the TCXO frequency can occur.

Many limitations of these conventional crystal packaging schemes have been addressed by harnessing the crystal oscillator in a flexible membrane, rather than mounting the crystal at discrete points. Installing a bare crystal in the flexible membrane generally involves opening the membrane by inserting some type of pin and/or rod within the membrane's slits. These pins typically remain in place while the crystal is inserted within the flexible membrane. Once the crystal is properly inserted, the pins may be removed by sliding them out, leaving the flexible membrane snugly harnessing the crystal.

Unfortunately, this type of approach tends to be extremely labor intensive and time consuming, and it risks damaging the crystal. The use of pins or other spacers also tends not to provide an accurate or consistent opening of the flexible membrane, and the pins and/or crystal may become dislodged during the process. Further, removal of the pins once the crystal is inserted may result in a shift of the crystal's position within the flexible membrane, and contact between the pins and the crystal may damage the crystal. Specifically, the pins may scratch or chip the surface of the crystal, which may degrade the performance and/or reliability of the crystal (or the device in which it resides).

SUMMARY

Generally, embodiments of the present invention feature methods and apparatus for harnessing a crystal oscillator in a flexible membrane without the use of spacers (e.g., pins, rods, or other small tools or objects) to open the flexible membrane, as the use of spacers may result in inconsistent opening of the flexible membrane and generally requires a large amount of manual manipulation, increasing the chances of damage and decreasing throughput and yield. Instead, in accordance with embodiments of the invention, the flexible membrane is accurately and consistently opened via application of force (for example, compression) by, e.g., an assembly fixture, to form the opening for the crystal. The assembly fixture may also hold the flexible membrane securely in place during crystal insertion. This approach enables efficient and accurate placement of the crystal within the flexible membrane, while minimizing the possibility of damage to the crystal during assembly. As utilized herein, harnessing of a crystal in a flexible membrane generally refers to positioning the crystal between at least two discrete portions of the membrane (which may be separated by, e.g., one or more slits), rather than, e.g., securing the crystal using string, thread, or other materials.

In one aspect, embodiments of the invention feature a method of mounting a crystal within a flexible membrane configured to harness the crystal. Opposing edges of a flexible membrane are compressed to form an opening therein, a crystal is inserted within the opening, and at least one opposing edge of the flexible membrane is retracted to harness the crystal within the flexible membrane.

Embodiments of the invention may include one or more of the following in any of a variety of combinations. The opening may be formed by bowing apart at least two discrete portions of the flexible membrane. At least one edge of the flexible membrane may be clamped with at least one mechanical clamp. Retracting the at least one opposing edge of the flexible membrane may include or consist essentially of retracting only one edge or two opposing edges of the flexible membrane. Compressing opposing edges of the flexible membrane may include or consist essentially of displacing only one edge toward an opposing edge. Compressing opposing edges of the flexible membrane may include or consist essentially of displacing two opposing edges toward each other. The opposing edges may be compressed by manipulation of at least one mechanical positioner. The opening may be formed without insertion of a spacer therein. The flexible membrane may be compressed and retracted without direct manual manipulation of the flexible membrane.

In another aspect, embodiments of the invention feature an assembly fixture for manipulating a flexible membrane during insertion or removal of a crystal. The assembly fixture includes a mechanism for securing the flexible membrane and at least one positioner for displacing at least a portion of the securing mechanism in order to manipulate the flexible membrane, thereby forming or reducing an opening in the flexible membrane.

Embodiments of the invention may include one or more of the following in any of a variety of combinations. The securing mechanism may include or consist essentially of a plurality of clamps, each clamp being configured to secure a peripheral portion of the flexible membrane. Each positioner may include a controller for controlling the displacement, and the controller may be automated or computer controlled. The positioner(s) may be secured to a substantially rigid base. Manipulating the flexible membrane may include compressing opposing edges and/or retracting at least one opposing edge thereof.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and, in some embodiments, ±5%. The term "consists essentially of" means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
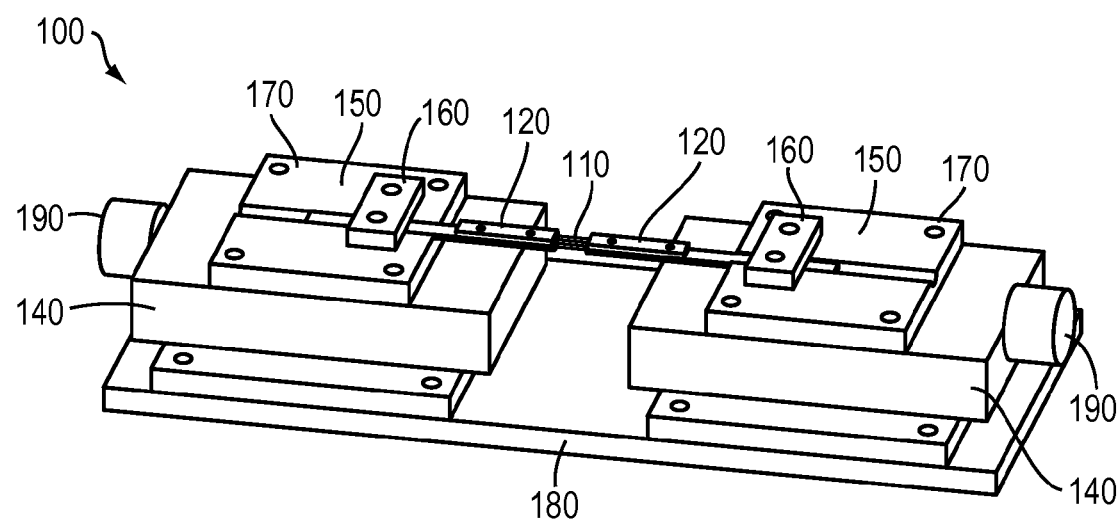
FIG. 1 is a perspective view of an assembly fixture in accordance with various embodiments of the invention.
Figure 2:
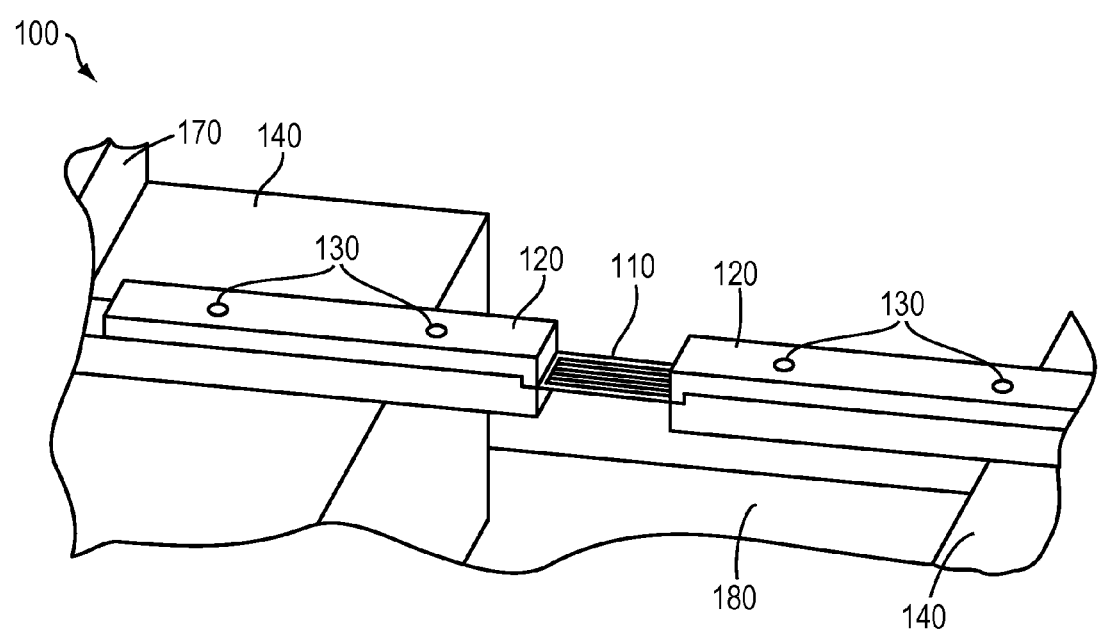
FIG. 2 is an enlarged portion of FIG. 1 depicting a flexible membrane secured in the assembly fixture in accordance with various embodiments of the invention.

FIGS. 1 and 2 depict an exemplary assembly fixture 100 for use in the placement of a crystal oscillator within a flexible membrane 110. As described in U.S. Patent Application Publication No. 2008/0150397 ("the '0397 application," the entire disclosure of which is incorporated by reference herein), flexible membrane 110 may isolate shock within the harness rather than allowing it to be transmitted to the crystal, thereby providing protection against stress. Flexible membrane 110 may also improve the thermal isolation of the crystal and help to reduce the signal and thermal path length between the crystal and its control chip.

In various embodiments, assembly fixture 100 includes at least one clamp 120 that grasps a peripheral (i.e., edge) portion of flexible membrane 110. For example, as illustrated in FIGS. 1 and 2, two clamps 120, each positioned on an opposite side of the flexible membrane 110, may be utilized to secure the flexible membrane 110. As shown, each clamp 120 includes a top and a bottom portion, which are drawn together using any suitable means or arrangement. In a specific embodiment, threaded turn screws 130 draw opposed surfaces of the top and bottom portions of each clamp 120 together, and may be adjusted to enable the insertion, securing in place (e.g., harnessing), and removal of flexible membrane 110 during the crystal insertion process detailed below. Of course, other means of retractably drawing the top and bottom clamp portions together—e.g., a spring or other elastic element—may be employed. Clamps 120 are typically sized and shaped for compatibility with one or more different types, sizes, and/or shapes of flexible membrane 110, and may be constructed out of any of a number of suitable materials, including, but not limited to, polymeric materials, ceramic materials, metals such as stainless steel, or a combination of such materials.

In various embodiments, each clamp 120 is attached to another portion of assembly fixture 100 (e.g., a positioner 140) by a clamp holder 150. Each clamp holder 150 may fixedly retain its respective clamp 120 by, e.g., securing the clamp 120 between a top portion 160 and a bottom portion 170. Top and bottom portions 160, 170 may be affixed to each other and/or to positioner 140 using any suitable arrangement, including, but not limited to, threaded screws, bolts, other fastening devices, elastic elements such as springs, and/or vacuum or magnetic force. In some embodiments, each clamp holder 150 includes a longitudinal groove or opening configured to receive at least a portion of a clamp 120. For example, portions of a clamp 120 may be slidably received within the groove of bottom portion 170 of clamp holder 150.

As mentioned above, each clamp holder 150 may be affixed to a positioner 140, which may include or consist of, e.g., a micropositioner or similar apparatus enabling controllable translation of clamps 120. As described in more detail below, this translation of clamps 120 enables the controllable and repeatable opening of flexible membrane 110 so as to admit a crystal oscillator therein. In some embodiments, both positioners 140 are moveable, e.g., in substantially parallel directions; however, in other embodiments one positioner 140 is stationary while the other is moveable (thus still allowing for relative motion between the positioners). As shown, clamp holders 150 may be removably or permanently affixed to the tops of positioners 140, e.g., by bolts, screws, magnetic force, or vacuum. In some embodiments, edges of bottom portions 170 are more or less flush with edges of positioners 140, as shown in FIG. 1. Positioners 140, in turn, may be affixed to a base 180. Base 180 may be fabricated from a suitably rigid material, e.g., a polymer, a ceramic, a metal such as stainless steel, or a combination of such materials. Thus constructed, assembly fixture 100 provides a stationary platform for crystal insertion, in which only controllers 190 on micropositioners are required to control the opening and closing of the flexible membrane 110. Positioners 140 may be slidably attached to base 180 as discussed in further detail below.

As mentioned above, positioners 140 can control the movement of at least one of the clamps 120, and may themselves be controlled using any suitable technique, including but not limited to manual and/or automated operation. For example, a positioner 140 may include a controller 190 such as the adjustable knob depicted in FIG. 1, which may control the movement of a clamp 120 relative to base 180 via a lead screw. In this case, rotation of controller 190 in one direction moves the associated clamp 120 towards the opposite clamp 120, while rotation of controller 190 in the opposite direction draws the associated clamp 120 in the opposite direction. Controller 190 may function in any number of ways, and may even be automated or computer controlled. In some embodiments, one or more of the controllers 190 prevents translation of clamps 120 beyond a certain distance (e.g., by means of a stop) in one or more directions in order to prevent damage to a flexible membrane 110 secured thereby.

Figure 3:
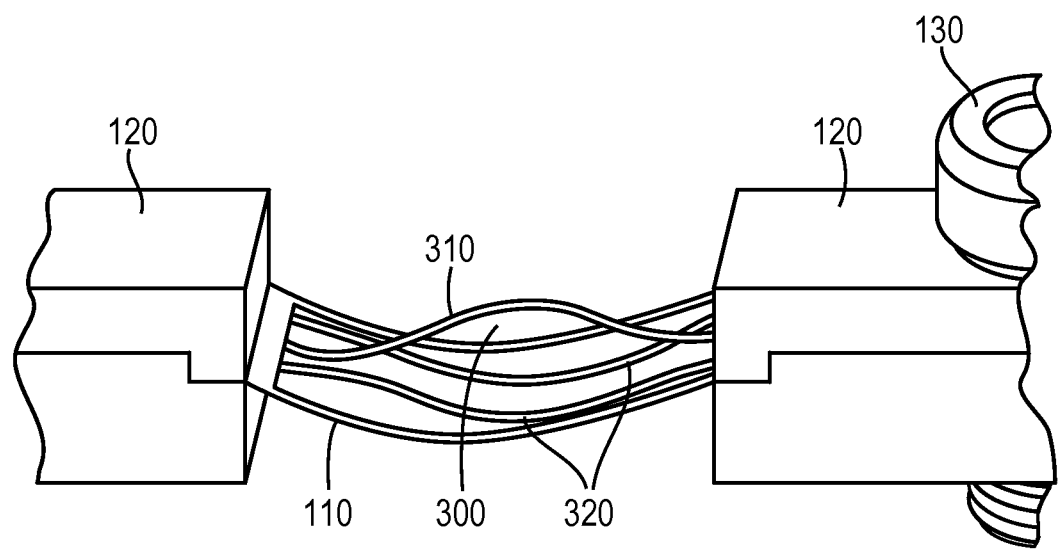
FIG. 3 is a side view of a flexible membrane secured in an open position by an assembly fixture in accordance with various embodiments of the invention.
Figure 4:
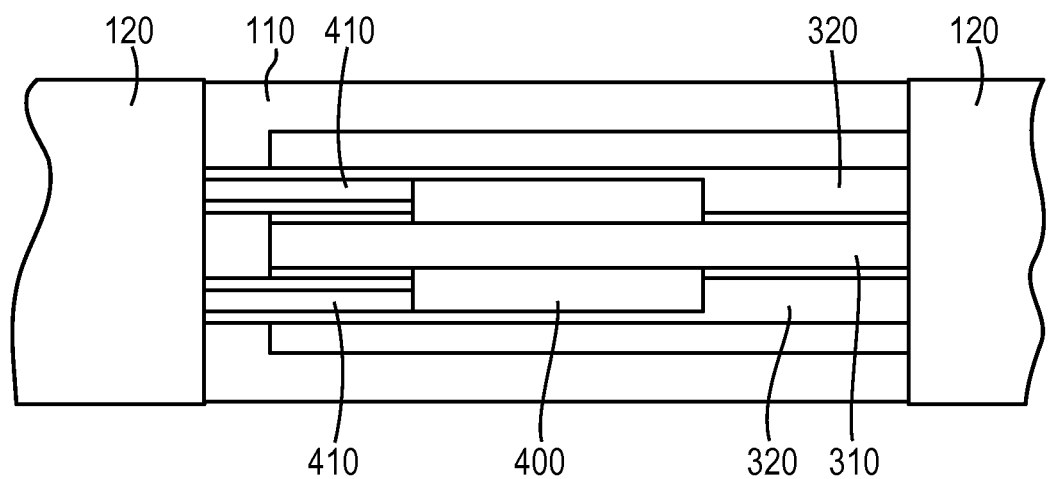
FIG. 4 is a plan view of a piezoelectric crystal harnessed within a flexible membrane after insertion therein in accordance with various embodiments of the invention.

In accordance with various embodiments of the present invention, the flexible membrane 110 is secured by clamps 120, at least one of which is translated (by, e.g., positioner 140) so that a force, e.g., a compressive force, is applied to flexible membrane 110. As shown in FIG. 3, this controlled compression of flexible membrane 110 bows portions thereof in opposite directions, thereby forming an opening 300 between these membrane portions into which a crystal oscillator may be inserted. In particular, the opening 300 may be formed between a first flexible portion 310 of flexible membrane 110 and one or more second flexible portions 320 of flexible membrane 110. Flexible membrane 110 is compressed such that opening 300 is large enough for easy insertion of the crystal. As shown in FIG. 4, a crystal 400 may then be introduced within opening 300 (either manually or using a mechanical positioner), and at least one of the clamps 120 may be translated away from the other, thus retracting one or more edges of flexible membrane and thereby reducing the size of opening 300 (i.e., drawing bowed membrane portions 310, 320 toward each other) so that crystal 400 is harnessed securely in place between flexible portions 310, 320. As utilized herein, retracting a portion of flexible membrane 110 refers to the controlled displacement of the portion away from another portion (e.g., an opposing edge portion), which generally results in controlled relief of at least some of the compression previously applied to the membrane. As shown in FIG. 4, one or more of flexible portions 310, 320 of flexible membrane 110 may be conductive or incorporate conductive traces 410 to facilitate electrical contact to crystal 400.

Once harnessed, the crystal 400 may be attached to flexible membrane 110 using any of a number of suitable techniques. In some embodiments, for example, indium solder or conductive epoxy is used to bond the crystal 400 to flexible membrane 110. These materials may also be used to establish electrical connections, e.g., to flexible membrane 110 and/or to external components. In some embodiments, flexible membrane 110 includes or consists essentially of a polymeric and/or dielectric film such as the KAPTON polyimide film supplied by E.I. du Pont de Nemours Co., Wilmington, Del. Flexible membrane 110 may also include or consist essentially of liquid crystal polymer, polyester, polyvinyl chloride, and/or TEFLON.

Once the crystal 400 has been harnessed within flexible membrane 110 and electrically connected to control circuitry (not shown), the device thus formed may be utilized in a wide range of applications. For example, the device may be configured to generate a high-frequency (e.g., approximately 20 GHz) clock signal, and/or may be utilized as a TCXO, MCXO, or OCXO in accordance with designs well known in the art. Additionally and/or alternatively the crystal package may be utilized in test equipment or global positioning system (GPS) applications or other navigational systems.

Assembly fixture 100 may incorporate positioners and/or other components having custom-designed and machined parts tailored to the dimensions and features of a specific flexible membrane 110. As described in the '0397 application, flexible membrane 110 is generally planar and discrete, and may be arranged in any of a variety of different configurations and shapes, including, but not limited to, square, rectangular, quadrilateral, polygonal, and circular. For example, flexible membrane 110 may be approximately rectangular, and may have areal dimensions of approximately 6 millimeters (mm) by approximately 3 mm. The flexible membrane 110 may be of any suitable thickness, for example, approximately 12 to 25 micrometers. Generally, the shape, size, and thickness of flexible membrane 110 are large enough to accommodate a piezoelectric crystal 400.

The embodiments described herein generally provide ease of operation while improving accuracy and repeatability by eliminating the manual labor steps typically required for inserting and mounting a crystal within a flexible membrane, e.g., direct manual manipulation (i.e., handling by hand, rather than mechanically, e.g., via a stationary tool such as the assembly fixture herein described) of the membrane. As discussed above, the embodiments described herein may be used to minimize the manual handling of both the crystal and the flexible membrane. The reduction in the amount of manual labor required for assembly increases cost efficiency by, e.g., decreasing assembly time, and minimizes the chances of damage to the individual parts and/or finished device. Further, and as discussed above, the assembly fixture and method may be automated and/or computer controlled (e.g., by implementing digital controllers for the positioners 140).

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An assembly fixture for manipulating a flexible membrane during insertion or removal of a crystal, comprising:
   a mechanism for securing the flexible membrane; and
   at least one positioner for displacing at least a portion of the securing mechanism to impart a compressive force upon the flexible membrane, thereby forming an opening in the flexible membrane, and for thereafter displacing at least a portion of the securing mechanism to reduce the compressive force imparted upon the flexible membrane, thereby reducing the opening formed in the flexible membrane.

2. The assembly fixture of claim 1, wherein the securing mechanism comprises a plurality of clamps, each clamp being configured to secure a peripheral portion of the flexible membrane.

3. The assembly fixture of claim 2, wherein each positioner comprises a controller for controlling the displacements.

4. The assembly fixture of claim 3, wherein the controller comprises an adjustable knob.

5. The assembly fixture of claim 4, wherein rotation of a first positioner's adjustable knob in one direction moves a first clamp in one direction and wherein rotation of the first positioner's adjustable knob in an opposite direction draws the first clamp in the opposite direction.

6. The assembly fixture of claim 3, wherein the controller is automated or computer controlled.

7. The assembly fixture of claim 3, wherein a first positioner's controller prevents movement of a first clamp beyond a certain distance.

8. The assembly fixture of claim 1, wherein the at least one positioner is secured to a substantially rigid base.

9. The assembly fixture of claim 2 further comprising a plurality of clamp holders, and wherein each clamp is coupled to a separate positioner by one of the clamp holders.

10. The assembly fixture of claim 9, wherein each clamp holder comprises a longitudinal groove that slideably receives at least a portion of one of the clamps.

11. The assembly fixture of claim 9, wherein each positioner is configured to translate one of the clamps.

12. The assembly fixture of claim 8, wherein the at least one positioner is slideably attached to the base.

* * * * *